US009076689B2

(12) United States Patent
Yu et al.

(10) Patent No.: US 9,076,689 B2
(45) Date of Patent: Jul. 7, 2015

(54) REDUCING RESISTANCE IN SOURCE AND DRAIN REGIONS OF FINFETS

(71) Applicant: Taiwan Semiconductor Manufacturing Company, Ltd., Hsin-Chu (TW)

(72) Inventors: Chen-Hua Yu, Hsin-Chu (TW); Yu-Rung Hsu, Tainan (TW); Chen-Nan Yeh, Hsi-Chih (TW); Cheng-Hung Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/079,963

(22) Filed: Nov. 14, 2013

(65) Prior Publication Data
US 2014/0070318 A1 Mar. 13, 2014

Related U.S. Application Data

(62) Division of application No. 13/103,594, filed on May 9, 2011, which is a division of application No. 11/873,156, filed on Oct. 16, 2007, now Pat. No. 7,939,889.

(51) Int. Cl.
*H01L 27/01* (2006.01)
*H01L 27/12* (2006.01)
*H01L 31/0392* (2006.01)
*H01L 29/66* (2006.01)
*H01L 29/78* (2006.01)

(52) U.S. Cl.
CPC ...... *H01L 27/1211* (2013.01); *H01L 29/66795* (2013.01); *H01L 29/785* (2013.01)

(58) Field of Classification Search
CPC .............. H01L 29/785; H01L 29/7851; H01L 29/4908; H01L 27/1203
USPC .................. 257/347–354, 401–413, E27.112, 257/E29.147
See application file for complete search history.

(56) References Cited

U.S. PATENT DOCUMENTS

| 6,525,403 | B2 | 2/2003 | Inaba et al. |
| 6,706,571 | B1 | 3/2004 | Yu et al. |
| 6,858,478 | B2 | 2/2005 | Chau et al. |
| 6,905,622 | B2 | 6/2005 | Padhi et al. |
| 7,141,854 | B2 | 11/2006 | Lee et al. |
| 7,190,050 | B2 | 3/2007 | King et al. |

(Continued)

OTHER PUBLICATIONS

Lee, Y.-P. et al., "Selective Copper Metallization by Electrochemical Contact Displacement with Amorphous Silicon Film," Electrochemical and Solid State Letters, vol. 4, No. 7, 2001, pp. C47-C49.

(Continued)

*Primary Examiner* — Cuong Q Nguyen
(74) *Attorney, Agent, or Firm* — Slater & Matsil, L.L.P.

(57) ABSTRACT

A semiconductor structure includes a semiconductor fin on a top surface of a substrate, wherein the semiconductor fin includes a middle section having a first width; and a first and a second end section connected to opposite ends of the middle section, wherein the first and the second end sections each comprises at least a top portion having a second width greater than the first width. The semiconductor structure further includes a gate dielectric layer on a top surface and sidewalls of the middle section of the semiconductor fin; and a gate electrode on the gate dielectric layer.

20 Claims, 14 Drawing Sheets

(56) References Cited

U.S. PATENT DOCUMENTS

| | | |
|---|---|---|
| 7,247,887 B2 | 7/2007 | King et al. |
| 7,265,008 B2 | 9/2007 | King et al. |
| 7,508,031 B2 | 3/2009 | Liu et al. |
| 7,514,325 B2 | 4/2009 | Kim et al. |
| 7,528,465 B2 | 5/2009 | King et al. |
| 7,605,449 B2 | 10/2009 | Liu et al. |
| 7,667,271 B2 * | 2/2010 | Yu et al. ............ 257/347 |
| 7,863,683 B2 * | 1/2011 | Kim et al. ........... 257/347 |
| 2005/0153490 A1 | 7/2005 | Yoon et al. |
| 2005/0156202 A1 | 7/2005 | Rhee et al. |
| 2005/0173768 A1 | 8/2005 | Lee et al. |
| 2006/0157749 A1 | 7/2006 | Okuno |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0235818 A1 | 10/2007 | Anderson et al. |
| 2007/0235819 A1 | 10/2007 | Yagishita |
| 2008/0185650 A1 * | 8/2008 | Chen et al. ............ 257/348 |
| 2008/0265321 A1 | 10/2008 | Yu et al. |
| 2008/0290470 A1 | 11/2008 | King et al. |
| 2008/0296632 A1 | 12/2008 | Moroz et al. |
| 2009/0181477 A1 | 7/2009 | King et al. |

OTHER PUBLICATIONS

Magagnin, L. et al., "Gold Deposition by Galvanic Displacement on Semiconductor Surfaces: Effect of Substrate on Adhesion," J. Phys. Chem. B., vol. 106, No. 2, 2002, pp. 401-407.

* cited by examiner

REDUCING RESISTANCE IN SOURCE AND DRAIN REGIONS OF FINFETS

This application is a divisional of U.S. patent application Ser. No. 13/103,594, entitled "Reducing Resistance on Source and Drain Regions of FinFETs," filed on May 9, 2011, which application is a divisional of U.S. patent application Ser. No. 11/873,156, entitled "Reducing Resistance in Source and Drain Regions of FinFETs," filed Oct. 16, 2007, now U.S. Pat. No. 7,939,889 issued May 10, 2011, which application is hereby incorporated herein by reference.

TECHNICAL FIELD

This invention relates generally to semiconductor devices, and more particularly to structures and formation methods of fin field-effect transistors (FinFET).

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed. FIG. 1 illustrates a perspective view of a conventional FinFET. Fin 4 is formed as a vertical silicon fin extending above substrate 2, and is used to form source and drain regions 6 and a channel region therebetween (not shown). A vertical gate 8 intersects the channel region of fin 4. While not shown in FIG. 1, a gate dielectric separates the channel region from vertical gate 8. FIG. 1 also illustrates oxide layer 18, and insulating sidewall spacers 12 and 14 formed on source and drain regions 6 and vertical gate 8, respectively. The ends of fin 4 receive source and drain doping implants that make these portions of fin 4 conductive.

The introduction of FinFETs has the advantageous feature of increasing drive current without the cost of occupying more chip area. However, the FinFETs also suffer from drawbacks. With the increasing down-scaling of FinFETs, the increasingly smaller sizes of the fins result in the increase of the resistances in the source/drain regions, and hence the degradation of device drive currents. The contact resistances between contact plugs and source/drain silicide regions are also increased due to the small fin areas. Additionally, it is difficult to form contact plugs connected to source/drain silicide regions of the FinFETs. This is because the fins of the FinFETs have small areas, the landing areas for the corresponding contact plugs are thus small. The process window for landing contact plugs accurately on fins is thus small.

Accordingly, what is needed in the art is a semiconductor device that may incorporate FinFETs thereof to take advantage of the benefits associated with increased drive currents without increasing the chip area usage while at the same time overcoming the deficiencies of the prior art.

SUMMARY OF THE INVENTION

In accordance with one aspect of the present invention, a semiconductor structure includes a semiconductor fin on a top surface of a substrate, wherein the semiconductor fin includes a middle section having a first width; and a first and a second end section connected to opposite ends of the middle section, wherein the first and the second end sections each comprises at least a top portion having a second width greater than the first width. The semiconductor structure further includes a gate dielectric layer on a top surface and sidewalls of the middle section of the semiconductor fin; and a gate electrode on the gate dielectric layer.

In accordance with another aspect of the present invention, a fin field-effect transistor (FinFET) includes a semiconductor fin on a top surface of a substrate, wherein the semiconductor fin comprises a middle section, and a first and a second end section on opposite ends of the middle section; a gate dielectric layer on a top surface and sidewalls of the middle section of the semiconductor fin; a gate electrode on the gate dielectric layer; and a fin spacer on a sidewall of one of the first and the second end sections, wherein the fin spacer comprises a bottom portion and a top portion formed of different materials, and wherein the bottom portion and the top portion are both in physical contact with the one of the first and the second end sections.

In accordance with yet another aspect of the present invention, a FinFET includes a semiconductor substrate; an insulating layer over the semiconductor substrate, wherein the insulating layer comprises an opening; a semiconductor material in the opening and extends above the opening, wherein a portion of the semiconductor material higher than the insulating layer forms a semiconductor fin, and wherein the semiconductor fin has a first width; a gate dielectric layer on a top surface and sidewalls of the semiconductor fin; a gate electrode on the gate dielectric layer; and a source and a drain region physically connected to the semiconductor fin and on opposite sides of the gate electrode, wherein the source and drain regions have a second width greater than the first width.

In accordance with yet another aspect of the present invention, a method of forming a semiconductor structure includes providing a substrate; and forming a semiconductor fin on a top surface of the substrate, which includes forming a middle section of the semiconductor fin having a first width; and forming a first and a second end section of the semiconductor fin on opposite ends of the middle section, wherein the first and the second end sections each comprises at least a top portion having a second width greater than the first width. The method further includes forming a gate dielectric layer on a top surface and sidewalls of the middle section of the semiconductor fin; forming a gate electrode on the gate dielectric layer; and forming fin spacers on sidewalls of the first and the second end sections.

In accordance with yet another aspect of the present invention, a method of forming a semiconductor structure includes providing a substrate; forming a semiconductor fin on a top surface of the substrate, wherein the semiconductor fin comprises a middle section, and a first and a second end sections on opposite ends of the middle section; forming a gate dielectric layer on a top surface and sidewalls of the middle section of the semiconductor fin, wherein the first and the second end portions are exposed; forming a gate electrode on the gate dielectric layer; forming fin spacers on sidewalls of the first and the second end sections; recessing at least top portions of the first and the second end sections to form recesses; removing at least portions of the fin spacers exposed through the recesses; and re-growing a semiconductor or conductive material in the recesses.

The advantageous features of the present invention include enlarging source/drain regions of FinFETs and reducing contact and source/drain resistances without the cost of more chip areas.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel fin field-effect transistor (FinFET) and the method of forming the same are presented. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1:
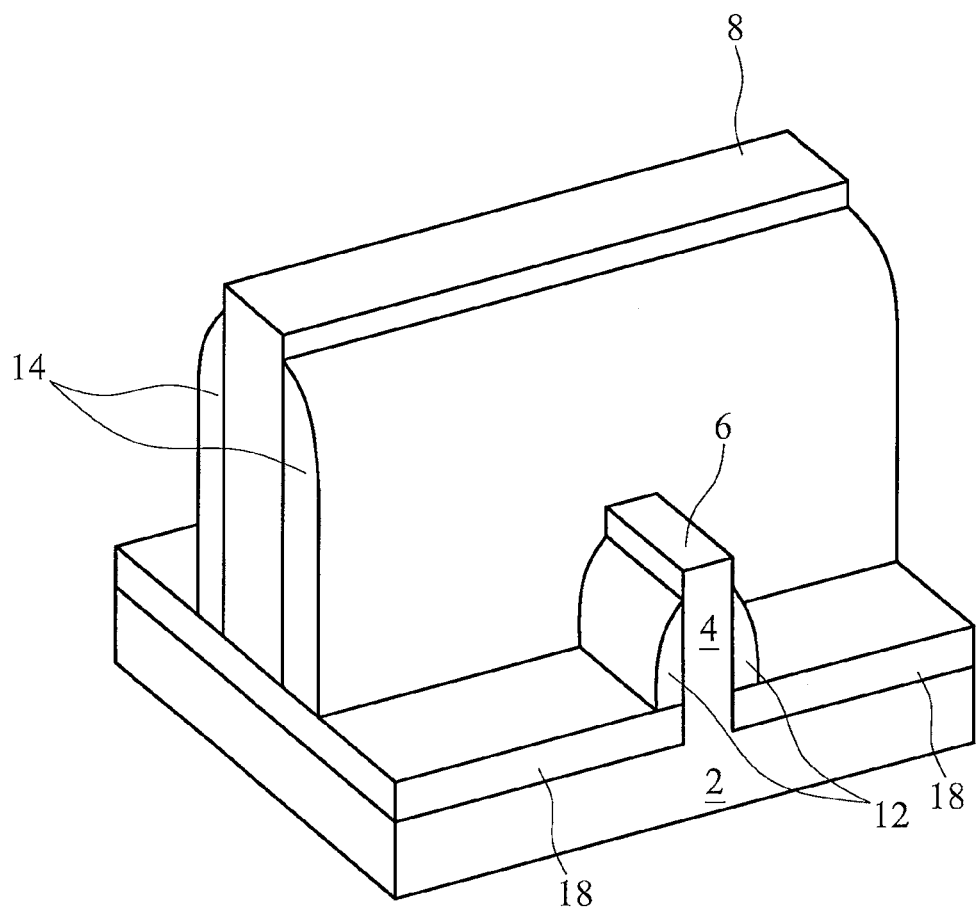
FIG. 1 illustrates a conventional fin field-effect transistor (FinFET)
Figure 2A:
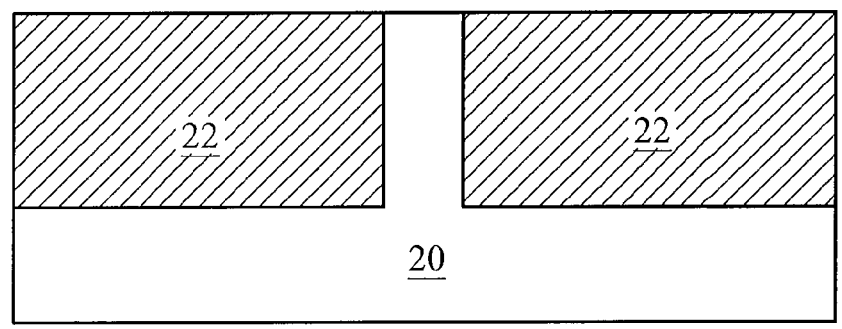
FIGS. 2A through 10C are cross-sectional views and perspective views of intermediate stages in the manufacturing of FinFET embodiments.
Figure 3A:
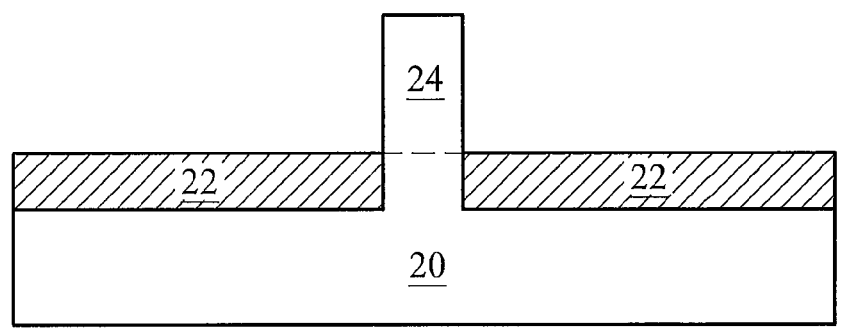

Referring to FIG. 2A, semiconductor substrate 20 is provided. Semiconductor substrate 20 may be a bulk silicon substrate, a bulk silicon-germanium substrate, or may have an epitaxy layer on bulk silicon, an epitaxy layer on bulk silicon-germanium, and the like. Trenches are then formed by recessing semiconductor substrate 20, followed by filling the trenches with a dielectric material to form insulating regions 22. Insulation regions 22 preferably include oxides, for example, high-density plasma (HDP) oxide. Insulating regions 22 are then recessed, as shown in FIG. 3A. As a result, a portion of the semiconductor material extending higher than the top surface of insulating regions 22 forms fin 24. Preferably, the recessing distance H, hence the height of fin 24, is between about 100 Å and about 900 Å. One skilled in the art will realize, however, that the recessing distance (the height of the fin) and other dimensions recited throughout the description are merely examples, and will scale with the down-scaling of the integrated circuits.

Figure 2B:
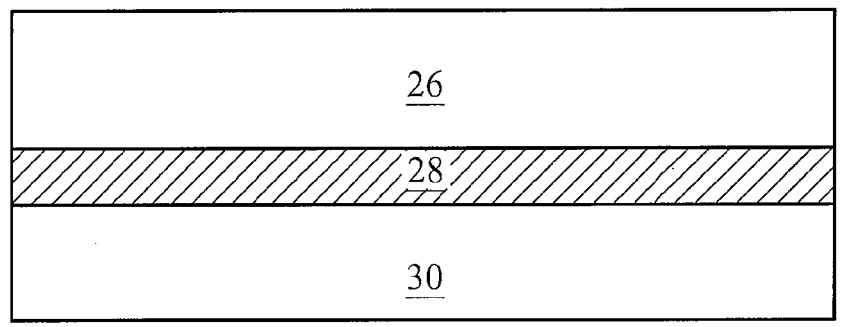
Figure 3B:
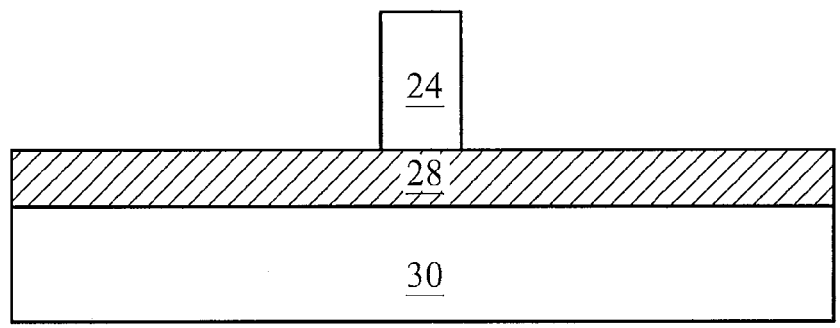

FIGS. 2B and 3B illustrate an alternative method for forming a fin. FIG. 2B illustrates a silicon-on-insulator structure, wherein an insulating layer 28 separates semiconductor layer 26 and base substrate 30. Semiconductor layer 26 may be formed of silicon or other commonly used semiconductor materials, such as silicon-germanium, silicon on silicon-germanium, and the like. Semiconductor layer 26 preferably has a thickness equal to the preferable fin height. Insulating layer 28 is preferably an oxide layer, and base substrate 30 is preferably a silicon substrate or other common semiconductor substrate. A selective etching may be used to remove portions of the semiconductor layer 26, leaving fin 24. In the following exemplary embodiment, the subsequently formed FinFET is shown as formed on the structure illustrated in FIG. 3A. However, the teaching is readily applicable to the structure shown in FIG. 3B.

Figure 4:
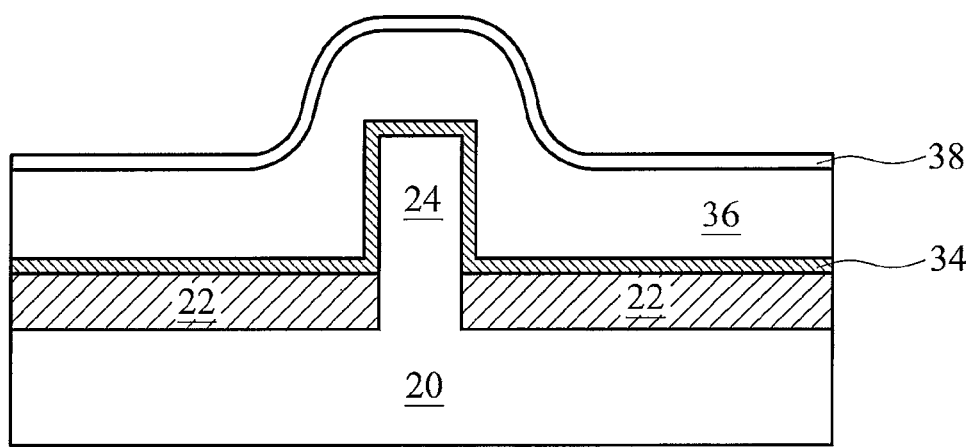

Referring to FIG. 4, gate dielectric layer 34, gate electrode layer 36, and mask layer 38 are formed. In an embodiment, gate dielectric layer 34 includes silicon oxide, which may be formed by a thermal oxidation of fin 24. In other embodiments, gate dielectric layer 34 includes dielectric materials having a high dielectric constant (k value), for example, greater than about 3.9. The preferred materials include silicon nitrides, oxynitrides, metal oxides such as $HfO_2$, $HfZrO_x$, $HfSiO_x$, $HfTiO_x$, $HfAlO_x$, and the like, and combinations and multi-layers thereof.

In an embodiment, gate electrode layer 36 is formed of polysilicon. In other embodiments, gate electrode layer 36 includes a material selected from metal nitrides (such as titanium nitride (TiN), tantalum nitride (TaN) and molybdenum nitride ($MoN_x$)), metal carbides (such as tantalum carbide (TaC) and hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides such as nickel silicide, and combinations thereof. The gate electrode layer 36 can also be a metal layer capped with a polysilicon layer.

Mask layer 38 may further be formed on top of gate electrode layer 36. Mask layer 38 preferably includes silicon nitride. Alternatively, other materials that are different from the subsequently formed fin spacers may be used.

Figure 5:
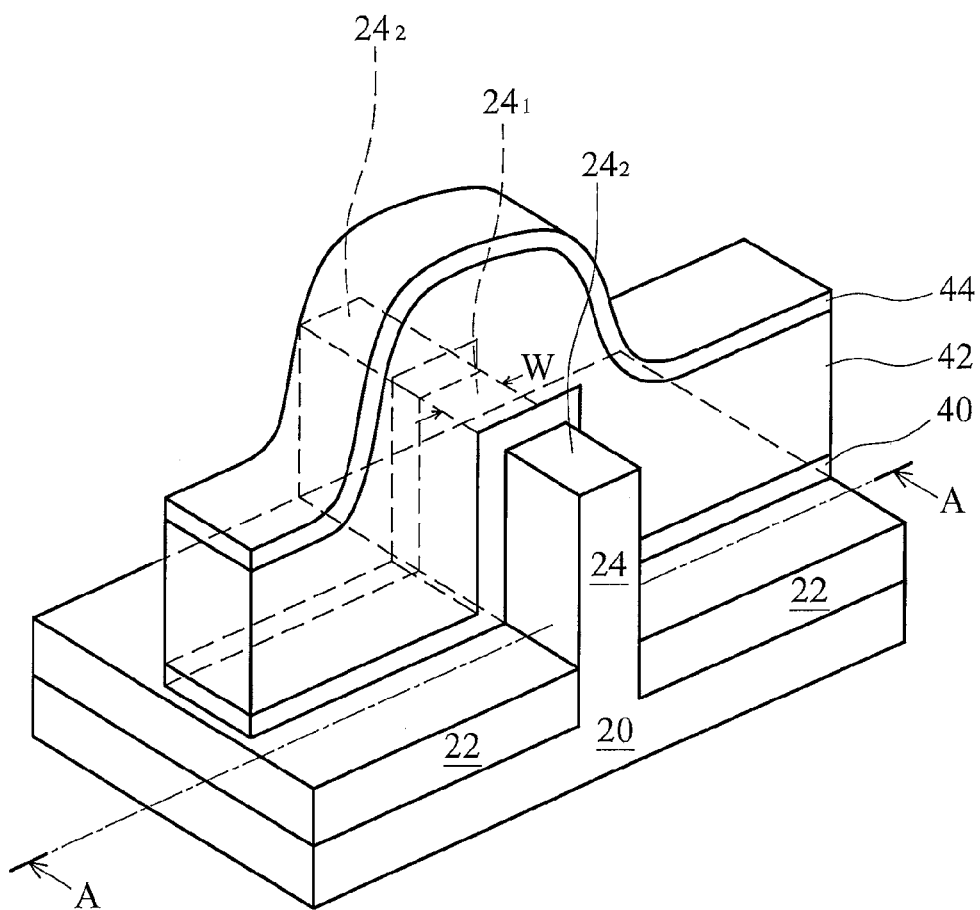

Gate dielectric layer 34, gate electrode layer 36, and mask layer 38 are then patterned, forming gate dielectric 40, gate electrode 42, and mask 44, respectively. FIG. 5 illustrates a perspective view of the resulting structure. As is known in the art, to form a FinFET device, a middle portion $24_1$ of fin 24 is covered by dielectric 40, gate electrode 42, and mask 44, while the end portions $24_2$ of fins 24 are exposed.

Figure 6:
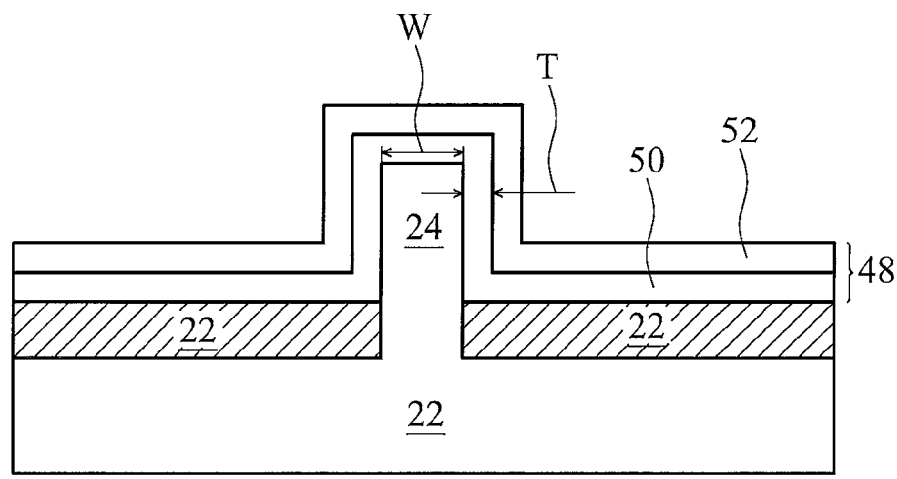

Next, as is illustrated in FIG. 6, which is a cross-sectional view taken along a plane crossing line A-A in FIG. 5, spacer layer 48 is formed. Accordingly, gate electrode 42 is not shown in the illustrated view. In the preferred embodiment, spacer layer 48 includes silicon nitride layer 52 on silicon oxide layer 50. The thickness T of silicon oxide 50 is preferably greater than about 30 percent of a width W of fin 24. In an exemplary embodiment, thickness T of silicon oxide 50 is about 200 Å, while width W of fin 24 is about 220 Å.

Figure 7:
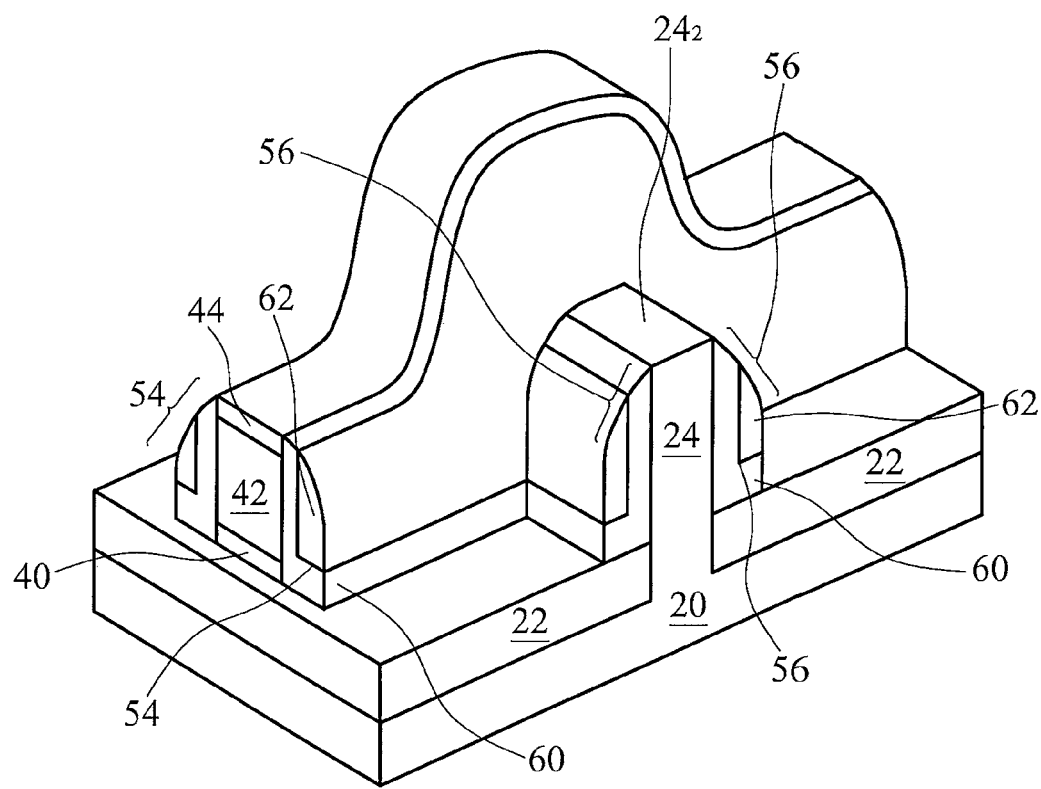

Next, as is shown in FIG. 7, spacer layer 48 is patterned, forming gate spacers 54 and fin spacers 56. In an exemplary embodiment, the patterning of the silicon nitride layer 52 (refer to FIG. 6) includes a dry etching using $CH_2F_2$ as an etchant, while the patterning of silicon oxide layer 50 includes a dry etching using $CF_4$ as an etchant. Alternatively, the patterning of silicon oxide layer 50 may be performed using wet etching with diluted HF as an etchant. Accordingly, each of the spacers 54 and fin spacers 56 includes a silicon nitride portion 62 on a silicon oxide portion 60.

Figure 8A:
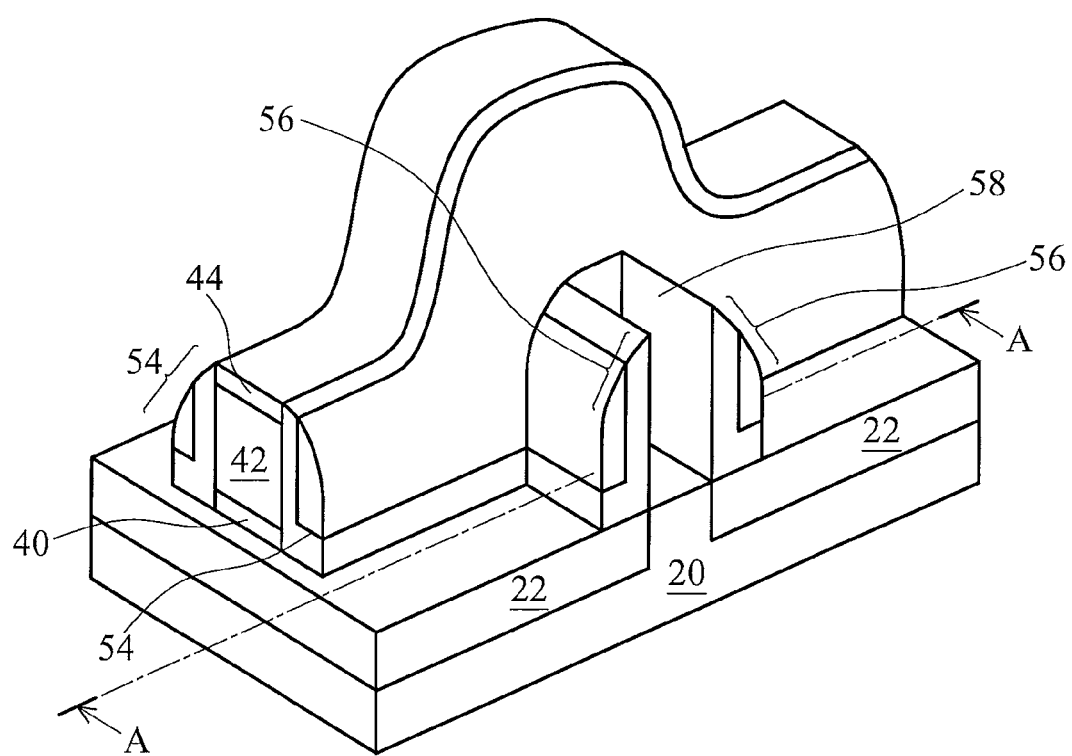
Figure 8B:
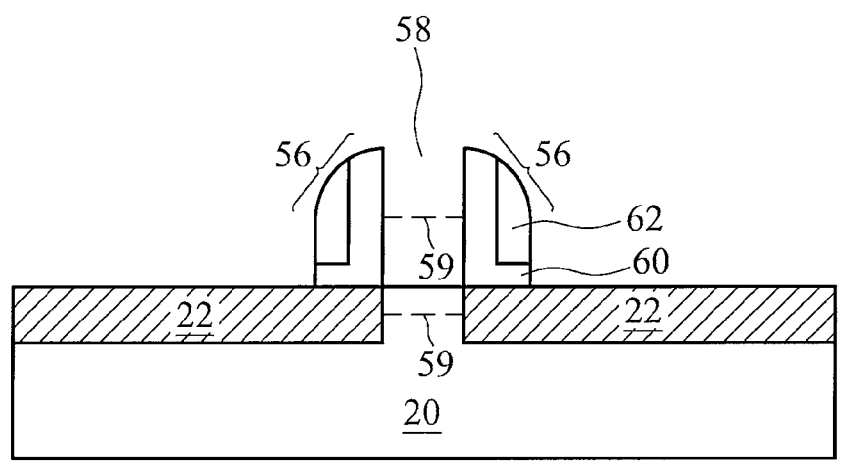

In FIGS. 8A and 8B, fin portions $24_2$ (refer to FIG. 7) are removed or recessed, forming openings 58, wherein one of the openings 58 is on the source side, and the other is on the drain side. FIG. 8A is a perspective view, and FIG. 8B is a cross-sectional view of a vertical plane crossing line A-A. Preferably, the recessing of fin portions $24_2$ is performed by dry etching, wherein HBr may be used as an etchant. Fin portion $24_1$, which is covered by mask layer 44 and gate electrode 42, is protected by mask layer 44 and gate spacers 54. In the preferred embodiment, fin portions $24_2$ are substantially completely removed. In other embodiments, fin portions $24_2$ are only partially recessed, preferably to a depth greater than the depth of the subsequently formed source/drain silicide. In yet other embodiments, openings 58 extend to between the top and bottom surface of the insulating layer 22. The possible alternative bottom positions of openings 58 are shown as dashed lines 59 in FIG. 8B. In the case fin 24 is formed on an insulating material (refer to FIG. 3B), a bottom layer of fin portion $24_2$ must be left for the subsequent epitaxial growth.

Figure 9A:
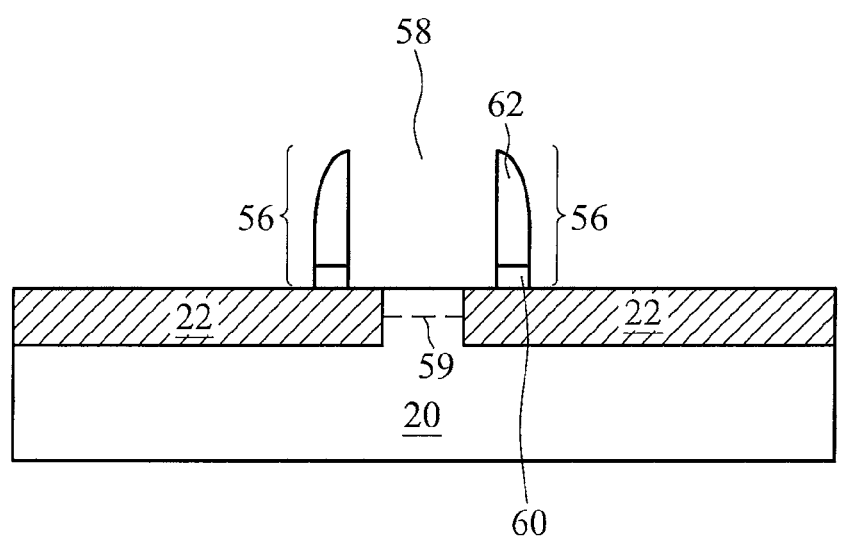
Figure 9B:
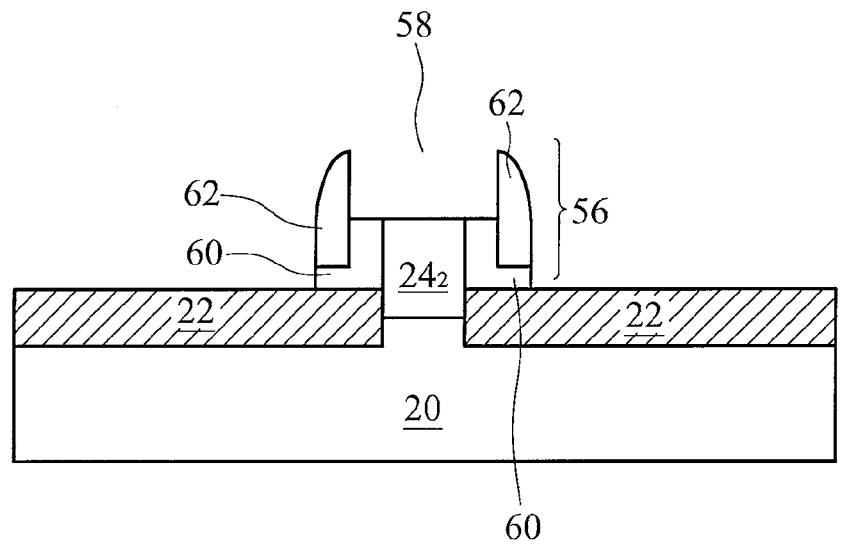
Figure 9C:
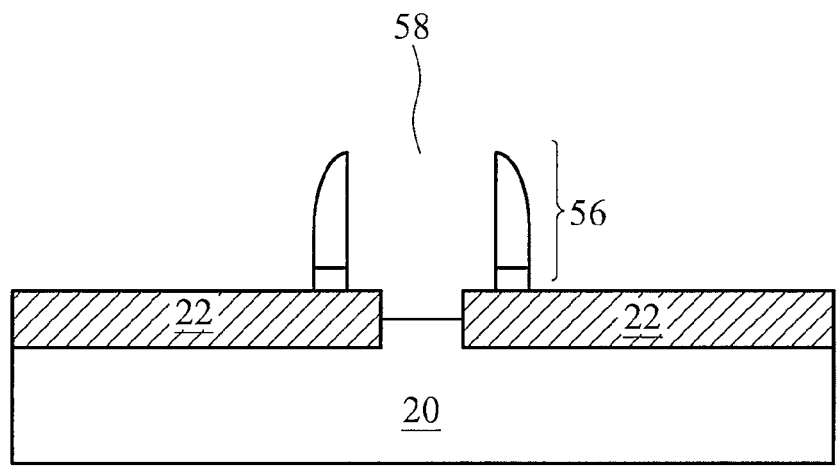

Referring to FIGS. 9A through 9C, openings 58 are expanded by removing portions of fin spacers 56 exposed through openings 58. In an embodiment, the vertical portions (also referred to as legs) of silicon oxide 60, which are exposed in the recessed fin, are removed. The horizontal portions of silicon oxide 60, however, are preferably left. As a result, openings 58 are widened. In an embodiment, the removal of the vertical portions of silicon oxide 60 is performed using dry etching using $CF_4$ as an etchant.

FIGS. 9B and 9C are alternative embodiments for forming and expanding openings 58. In FIG. 9B, only a top portion of each of the fin portions $24_2$ is removed. Accordingly, only a top portion of each of the silicon oxides 60 is removed. For fins formed on insulating layers, as is shown in FIG. 3B, at least thin bottom layers of the remaining fins $24_2$ need to remain. The resulting structure is similar to that is shown in FIG. 9B, except remaining fins $24_2$ are on an insulating layer. In FIG. 9C, not only are fin portions $24_2$ fully removed, openings 58 further extend into the space between insulating regions 22.

In the exemplary embodiments discussed in the preceding paragraphs, fin spacers 56 include silicon nitride portions 62 on silicon oxide portions 60, one skilled in the art will realize that different dielectric materials can be used, providing the outer portions 62 and the inner portions 60 have a high etching selectivity.

Figure 10A:
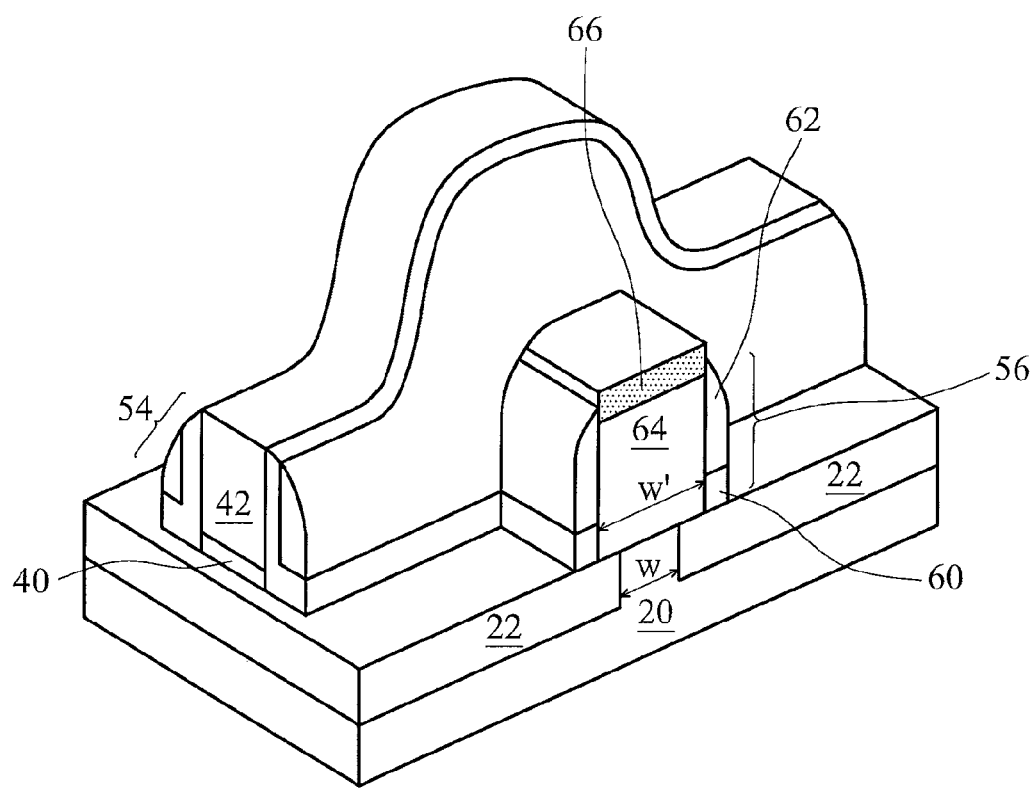
Figure 10B:
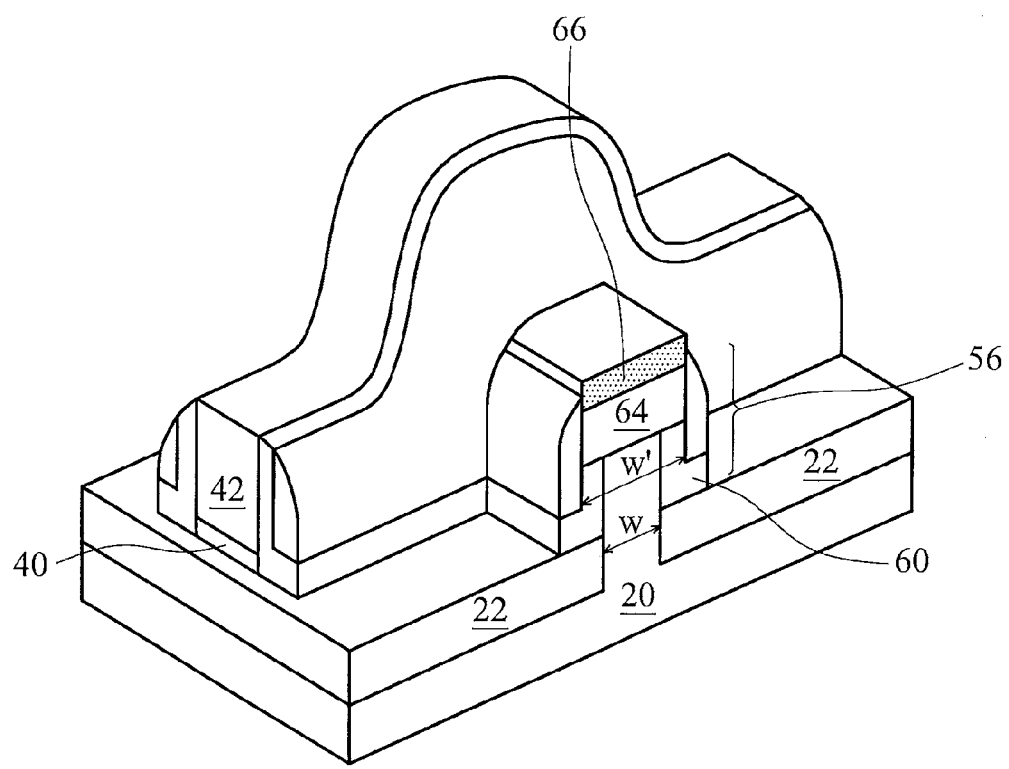
Figure 10C:
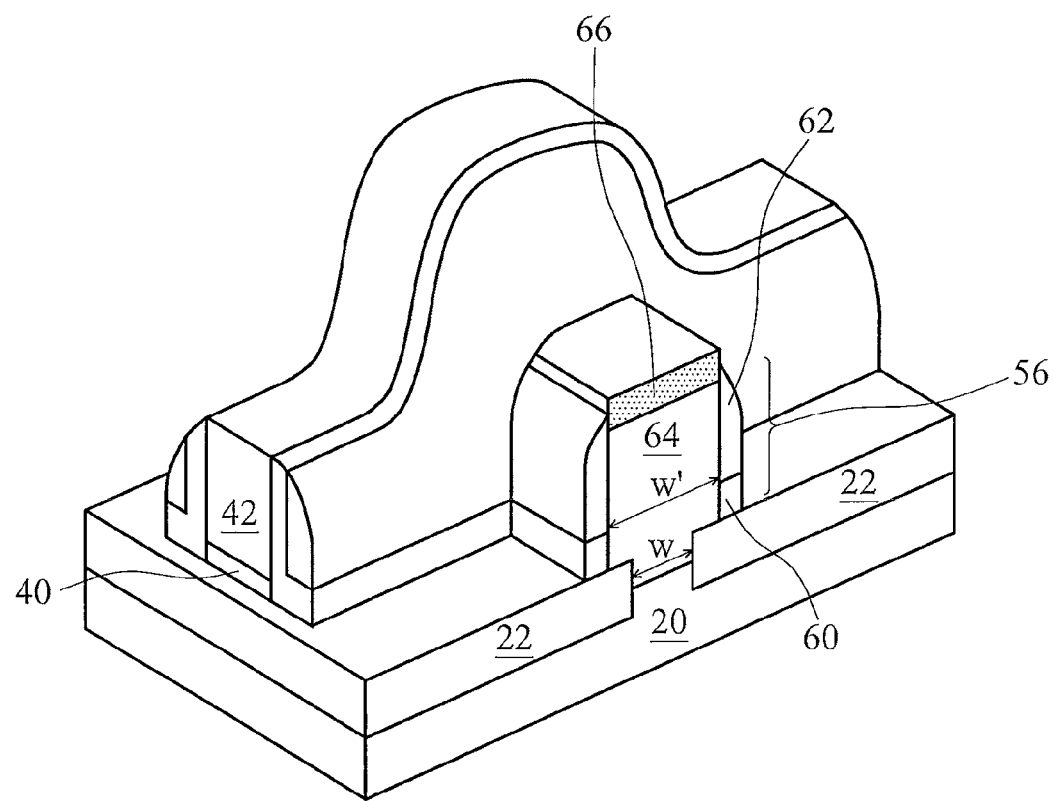

FIGS. 10A through 10C illustrate the filling of openings 58 with a semiconductor material to re-grow fins 64, one on the source side, and the other on the drain side. In an embodiment, the fin re-growth is performed by selective epitaxial growth (SEG). In alternative embodiments, the fin re-growth is performed using selective plating. The re-grown semiconductor material may include silicon. Alternatively, the re-grown semiconductor material may include silicon germanium (SiGe) if the resulting FinFET is of p-type, or silicon carbon if the resulting FinFET is of n-type. Desirable p-type or n-type impurities may be doped when the re-growth proceeds. The resulting re-grown fins 64 may have a top surface high, lower, or level with the top surface of fin portion $24_1$ (not shown, please refer to FIG. 5).

The resulting re-grown fins 64 have a significantly increased with W' over width W of fin portion $24_1$ (please also refer to FIG. 5). In an exemplary embodiment, width W of fin portion $24_1$ is about 220 Å, the thickness of the removed silicon oxide 60 is about 200 Å (refer to FIG. 9A). Width W' of the re-grown fins 64 is thus about 620 Å, an increase of more than 180 percent.

After the fin re-growth, mask 44 (refer to FIG. 5) is removed. Implantations are then performed to introduce p-type or n-type impurities into the re-growth fins 64 to form source and drain regions. Next, source/drain silicide regions 66 are formed. As is known in the art, the formation of source/drain silicide regions 66 include blanket forming a metal layer, and annealing the metal layer to cause a silicidation between the metal layer and the underlying silicon or silicon germanium. The un-reacted metal layer is then removed.

Advantageously, the FinFETs formed using the embodiments of the present invention have enlarged source/drain regions. Accordingly, the source/drain resistances are reduced. The enlargement of the source/drain regions also results in the enlargement of source/drain silicide regions, and hence the contact resistances between contact plugs and source/drain silicide regions are reduced. In addition, the enlargement of the source/drain regions causes an increase in the process window for forming source/drain contact plugs, and the misalignment between contact plugs and source/drain regions is less likely to occur. The above-discussed advantageous features, however, comes with no cost to the short channel effect and drive current, since the size of the fin portion under gate electrode is not changed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a semiconductor fin at a top surface of a substrate, wherein the semiconductor fin comprises:
a middle section having a first width;
a first and a second end section connected to opposite ends of the middle section, wherein each of the first and the second end sections comprises at least a top portion having a second width greater than the first width;
a fin spacer on a sidewall of one of the first and the second end sections, wherein the fin spacer comprises a top portion and a bottom portion formed of different materials, and the bottom portion of the fin spacer comprises an inner portion overlapped by the top portion of the one of the first and the second end sections;
a gate dielectric layer on a top surface and sidewalls of the middle section of the semiconductor fin; and
a gate electrode over the gate dielectric layer.

2. The integrated circuit structure of claim 1, wherein the fin spacer further comprises an outer portion not overlapped by the top portion of the one of the first and the second end sections, wherein the inner portion and the outer portion comprise different materials.

3. The integrated circuit structure of claim 1 further comprising a gate spacer on a sidewall of the gate electrode, wherein the gate spacer comprises a first portion adjoining a sidewall of the gate electrode, and a second portion overlapping a horizontal portion of the first portion, and wherein the first portion of the gate spacer is formed of a same material as the inner portion of the bottom portion of the fin spacer.

4. The integrated circuit structure of claim 1, wherein each of the first and the second end sections of the semiconductor fin further comprises a bottom portion under the top portion, wherein the bottom portion comprises a same material, and has a same width, as the middle section of the semiconductor fin.

5. The integrated circuit structure of claim 4 further comprising an insulating region, with the semiconductor fin over and in contact with the insulating region.

6. The integrated circuit structure of claim 5, wherein the substrate comprises a semiconductor material extending into an opening in the insulating region, and wherein the semiconductor fin is connected to the extension.

7. The integrated circuit structure of claim 1, wherein the second width is greater than about 130 percent of the first width.

8. The integrated circuit structure of claim 1, wherein the top portion of each of the first and the second end sections of the semiconductor fin comprises a different material than the middle section.

9. An integrated circuit structure comprising:
 a semiconductor fin at a top surface of a substrate, wherein the semiconductor fin comprises:
  a middle section; and
  an end section connected to an end of the middle section, wherein the end section comprises a bottom portion and a top portion wider than the bottom portion;
 a gate dielectric layer on a top surface and sidewalls of the middle section of the semiconductor fin;
 a gate electrode over the gate dielectric layer; and
 a fin spacer on a sidewall of the end section, wherein the fin spacer comprises:
  a first layer comprising a horizontal leg and a vertical leg, wherein the vertical leg comprises:
   a first sidewall in contact with a sidewall of the bottom portion of the end section of the semiconductor fin; and
   a top surface in contact with a bottom surface of the top portion of the end section of the semiconductor fin.

10. The integrated circuit structure of claim 9, wherein the bottom portion and the top portion of the end section are formed of different materials.

11. The integrated circuit structure of claim 9, wherein the fin spacer further comprises a second layer contacting a top surface of the horizontal leg and a second sidewall of the vertical leg, and wherein the second layer further contacts a sidewall of the top portion of the end section.

12. The integrated circuit structure of claim 11, wherein the first layer of the fin spacer comprises silicon oxide, and the second layer of the fin spacer comprises silicon nitride.

13. The integrated circuit structure of claim 11, wherein the second sidewall of the vertical leg is substantially aligned with the sidewall of the top portion of the end section.

14. The integrated circuit structure of claim 9 further comprising an insulating region in the substrate, wherein the horizontal leg of the first layer of the fin spacer comprises a bottom surface contacting a top surface of the insulating region, and wherein an edge of the insulating region is aligned to the first sidewall of the vertical leg of the first layer.

15. An integrated circuit structure comprising:
 a semiconductor substrate;
 an insulating region over the semiconductor substrate, wherein the insulating region comprises an opening;
 a semiconductor material with portions in the opening and above the opening, wherein a portion of the semiconductor material higher than the insulating region forms a semiconductor fin, and wherein the semiconductor fin has a first width;
 a gate dielectric layer on a top surface and sidewalls of a middle section of the semiconductor fin;
 a gate electrode over the gate dielectric layer;
 a source/drain region physically connected to a side of the gate electrode, wherein the source/drain region has a second width greater than the first width; and
 a fin spacer comprising:
  a bottom portion comprising a top surface contacting a bottom surface of the source/drain region; and
  a top portion comprising a sidewall contacting a sidewall of the source/drain region, with the bottom portion and the top portion of the fin spacer formed of different materials.

16. The integrated circuit structure of claim 15, wherein the semiconductor fin comprises silicon, and wherein the source/drain region comprises silicon germanium.

17. The integrated circuit structure of claim 15, wherein the semiconductor fin comprises silicon, and wherein the source and the drain regions comprise silicon carbon.

18. The integrated circuit structure of claim 15, wherein the bottom portion comprises silicon oxide, and wherein the top portion comprises silicon nitride.

19. The integrated circuit structure of claim 15, wherein the bottom portion of the fin spacer comprises an L-shaped portion, wherein the top portion of the fin spacer overlaps a horizontal leg of the L-shaped portion, and wherein the top surface of the bottom portion of the fin spacer is a top surface of the L-shaped portion.

20. The integrated circuit structure of claim 19, wherein a top end of the top portion is higher than the top surface of the L-shaped portion.

* * * * *